US010802348B2

(12) United States Patent
Yang et al.

(10) Patent No.: US 10,802,348 B2
(45) Date of Patent: Oct. 13, 2020

(54) ARRAY SUBSTRATE, DISPLAY PANEL AND DISPLAY DEVICE

(71) Applicant: WuHan TianMa Micro-Electronics Co., Ltd., Wuhan (CN)

(72) Inventors: Qian Yang, Wuhan (CN); Huanda Wu, Wuhan (CN); Lei Zhang, Wuhan (CN); Xiufeng Zhou, Wuhan (CN); Boping Shen, Wuhan (CN); Zhaokeng Cao, Wuhan (CN); Huangyao Wu, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 88 days.

(21) Appl. No.: 15/887,012

(22) Filed: Feb. 2, 2018

(65) Prior Publication Data
US 2019/0129224 A1 May 2, 2019

(30) Foreign Application Priority Data

Oct. 30, 2017 (CN) .......................... 2017 1 1052404

(51) Int. Cl.
G02F 1/1333 (2006.01)
G02F 1/1339 (2006.01)
(Continued)

(52) U.S. Cl.
CPC ........ *G02F 1/13394* (2013.01); *G02F 1/1368* (2013.01); *G02F 1/133514* (2013.01);
(Continued)

(58) Field of Classification Search
CPC ........... G02F 1/13394; G02F 1/133514; G02F 1/134336; G02F 1/136227; G02F 1/136286; G02F 1/1368
See application file for complete search history.

(56) References Cited

U.S. PATENT DOCUMENTS 8,724,066 B2 * 5/2014 Kim ...................... G02F 1/1343
349/143
2011/0141425 A1 * 6/2011 Moriya ............... G02F 1/13394
349/143

FOREIGN PATENT DOCUMENTS

CN 101952771 A 1/2011
CN 104407475 A 3/2015

OTHER PUBLICATIONS

Chinese Office Action dated Dec. 3, 2019 for corresponding CN Application No. 201711052404.5.

* cited by examiner

Primary Examiner — Sue A Purvis
Assistant Examiner — Scott Stowe
(74) Attorney, Agent, or Firm — Tarolli, Sundheim, Covell & Tummino LLP

(57) ABSTRACT

An array substrate, display panel and display device. The array substrate includes: a source-drain metal layer, a pixel electrode layer, an insulation layer located between the source-drain metal layer and the pixel electrode layer, and a plurality of sub-pixels distributed in an array. Each sub-pixel corresponds to a drain electrode contained in source-drain metal layer, a pixel electrode contained in pixel electrode layer, and a drain through-hole defined in insulation layer. The pixel electrode is connected to the drain electrode via the drain through-hole. For any one row of the array, in a column direction, each drain electrode through hole is located at the same side of the sub-pixel 10 corresponding to the drain electrode through hole. The sub-pixels includes two adjacent support sub-pixels in a row direction, and the two drain through-holes respectively corresponding to the two adjacent support sub-pixels are unaligned in the column direction.

10 Claims, 6 Drawing Sheets

(51) Int. Cl.
*H01L 27/12* (2006.01)
*G02F 1/1362* (2006.01)
*G02F 1/1335* (2006.01)
*G02F 1/1368* (2006.01)
*G02F 1/1343* (2006.01)
*G02F 1/1345* (2006.01)

(52) U.S. Cl.
CPC .. *G02F 1/134336* (2013.01); *G02F 1/136227* (2013.01); *G02F 1/136286* (2013.01); *H01L 27/124* (2013.01); *H01L 27/1248* (2013.01); *G02F 1/13452* (2013.01); *G02F 2001/13396* (2013.01); *G02F 2001/134345* (2013.01)

ARRAY SUBSTRATE, DISPLAY PANEL AND DISPLAY DEVICE

CROSS-REFERENCE TO RELATED APPLICATIONS

The present application claims priority to Chinese Patent Application No. 201711052404.5, filed on Oct. 30, 2017, the content of which is incorporated herein by reference in its entirety.

TECHNICAL FIELD

The present disclosure relates to the field of display technologies and, in particular, to an array substrate, a display panel and a display device.

BACKGROUND

In a liquid crystal displayer, a display panel includes a color film substrate and an array substrate arranged opposite to the color film substrate, and a liquid crystal layer is disposed between the color film substrate and the array substrate. In addition, a photo spacer is arranged between the color film substrate and the array substrate to maintain a certain cell gap between the color film substrate and the array substrate. Since various components are provided at a side of the array substrate facing toward the color film substrate, the flatness is relatively poor, and the photo spacer shall be disposed in a relatively flat area.

However, with the increase of display resolution, as for the surface of the array substrate facing toward the color film substrate, the area for placing the photo spacer is getting smaller and smaller, which easily causes the photo spacer to sink into a recess of the surface of the array substrate, thereby causing a problem of squeezing light leakage.

SUMMARY

The present disclosure provides an array substrate, a display panel and a display device, which can make the overlapping area between the photo spacer and the drain electrode through hole to be decreased, so that the problem of squeezing light leakage due to unevenness of the support surface of the photo spacer can be alleviated.

In one respect, the present disclosure provides an array substrate. The array substrate includes a source-drain metal layer, a pixel electrode layer, an insulation layer located between the source-drain metal layer and the pixel electrode layer, and a plurality of sub-pixels distributed in an array. Each of the plurality of sub-pixels corresponds to a drain electrode contained in the source-drain metal layer, a pixel electrode contained in the pixel electrode layer, and a drain through-hole defined in the insulation layer, and the pixel electrode is connected to the drain electrode via the drain through-hole. As for any one row of the array, in a column direction, each drain electrode through hole is located at the same side of the sub-pixel corresponding to the drain electrode through hole. The plurality of sub-pixels includes two adjacent support sub-pixels in a row direction, and the two drain through-holes respectively corresponding to the two adjacent support sub-pixels are unaligned with respect to each other in the column direction.

In another aspect, the present disclosure provides a display panel including the above-mentioned array substrate. The display panel further includes a color film substrate disposed opposite to the array substrate, and at least one photo spacer disposed between the array substrate and the color film substrate. The insulation layer in the array substrate is disposed at a side of the source-drain metal layer close to the color film substrate. An orthographic projection of the photo spacer on a plane where the array substrate is located overlaps with an area between the two drain through-holes corresponding to the two adjacent support sub-pixels in the row direction.

In still another aspect, the present disclosure provides a display device including the above-mentioned display penal.

The present disclosure provides an array substrate, a display panel and a display device, after the drain electrode through holes corresponding to two adjacent support sub-pixels in the row direction are arranged by being unaligned in the column direction, when the photo spacer deviates from an ideal position due to the processing and other reasons, the overlapping area between the photo spacer and the drain electrode through hole in the embodiments of the present disclosure is more likely to be decreased in comparison with the related art, so that the problem of squeezing light leakage due to uneven support surface of the photo spacer can be alleviated.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. The drawings described as follows are merely part of the embodiments of the present disclosure, other drawings can also be acquired by those skilled in the art without paying creative efforts.

DESCRIPTION OF EMBODIMENTS

In order to make the purposes, technical solutions, and advantages of the embodiments of the present disclosure to be clearer, the technical solutions in the embodiments of the present disclosure are clearly and completely described in the following with reference to the accompanying drawings. Obviously, the described embodiments are merely exemplary embodiments of the present disclosure, which shall not be interpreted as providing any limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

Figure 1:
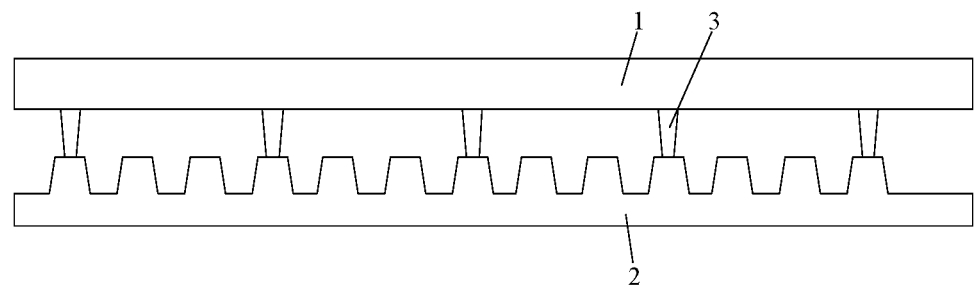
FIG. 1 is a structural schematic diagram of a liquid crystal display panel in the related art.

As shown in FIG. 1, which is a structural schematic diagram of a liquid crystal display panel in the related art, in a liquid crystal displayer, a display panel includes a color film substrate 1 and an array substrate 2 arranged opposite to the color film substrate 1. A liquid crystal layer is disposed between the color film substrate 1 and the array substrate 2, and a photo spacer 3 is arranged between the color film substrate 1 and the array substrate 2 to maintain a certain cell gap between the color film substrate 1 and the array substrate 2. Since various components are provided at a side of the array substrate 2 facing toward the color film substrate 1, the flatness is relatively poor, and the photo spacer 3 is disposed in a relatively flat area.

However, with the increase of display resolution, as for the surface of the array substrate 2 facing toward the color film substrate 1, the area for placing the photo spacer is getting smaller and smaller, which easily causes the photo spacer 3 to sink into a recess of the surface of the array substrate 2, thereby causing a problem of squeeze light leakage.

Figure 2:
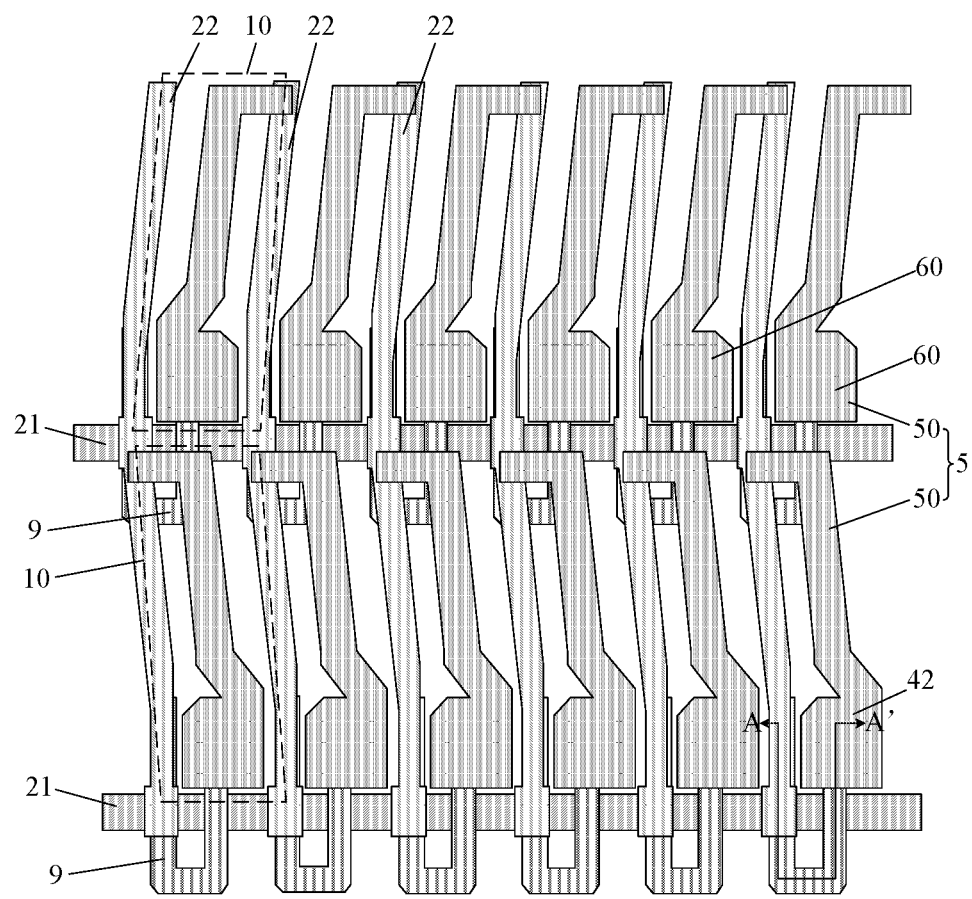
FIG. 2 is a top view of a partial region of an array substrate provided by an embodiment of the present disclosure.
Figure 3:
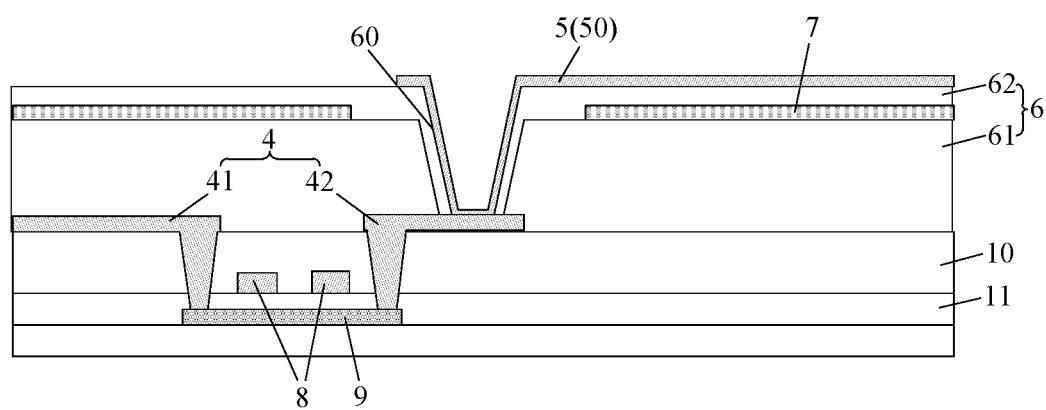
FIG. 3 is a schematic cross-sectional view along AA' direction in FIG. 2.

As shown in FIG. 2 and FIG. 3, FIG. 2 is a top view of a partial region of an array substrate provided by an embodiment of the present disclosure, FIG. 3 is a schematic cross-sectional view along AA' direction in FIG. 2. The present disclosure provides an array substrate, including: a source-drain metal layer 4, a pixel electrode layer 5 and an insulation layer 6 located between the source-drain metal layer 4 and the pixel electrode layer 5; a plurality of sub-pixels 10 distributed in an array. The source-drain metal layer 4 includes a plurality of source electrodes 41 and a plurality of drain electrodes 42, and each sub-pixel 10 corresponds to a source electrode 41 and a drain electrode 42. The pixel electrode layer 5 includes a plurality of pixel electrodes 50, and each sub-pixel 10 corresponds to a pixel electrode 50. The insulation layer 6 includes a plurality of drain electrode through holes 60, and each sub-pixel 10 corresponds to a drain electrode through hole 60. In each of the sub-pixel 10, the pixel electrode 50 is connected to the drain electrode 42 via the drain electrode through 60. As for any one row of sub-pixels 10 of the plurality of sub-pixels 10, in a column direction, each drain electrode through hole 60 is located at the same side of its corresponding sub-pixel 10. For example, as shown in FIG. 2, as for each row of sub-pixels 10, each drain electrode through hole 60 is located at a lower position of its corresponding sub-pixel 10. The plurality of sub-pixels 10 includes two adjacent support sub-pixels in the row direction (e.g., the leftmost two sub-pixels 10 and the rightmost two sub-pixels 10 in each row shown in FIG. 2). As for two adjacent support sub-pixels in the row direction, two drain electrode through holes 60 are arranged by being unaligned in the column direction, that is, in the column direction, there is a certain interval between the centers of the two adjacent drain electrode through holes 60, and thus the centers of the two adjacent drain electrode through holes 60 are not disposed in the same level.

Figure 4:
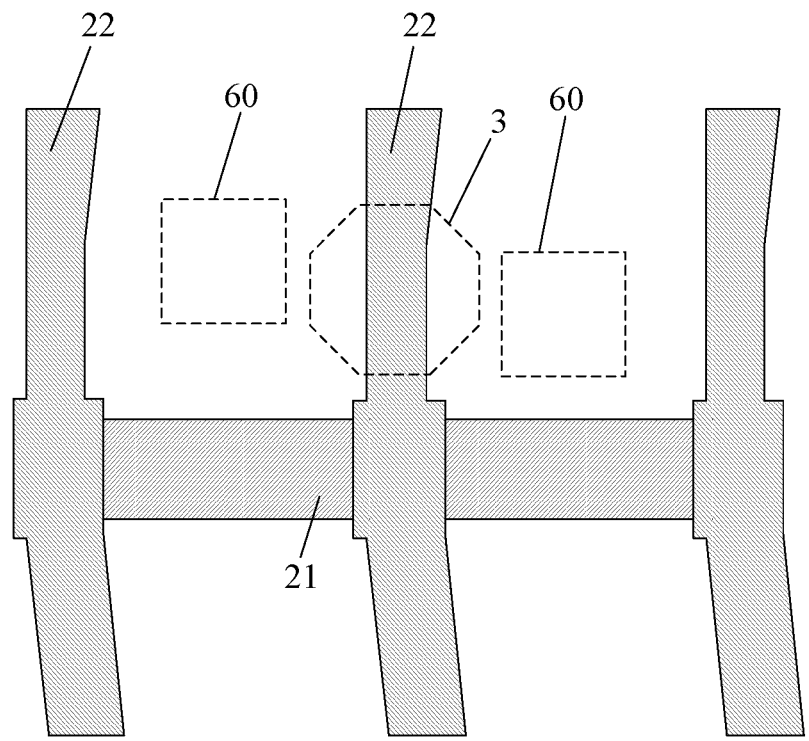
FIG. 4 is a schematic diagram showing a position relation between the drain electrode through hole and the photo spacer in the partial region in FIG. 2.
Figure 5:
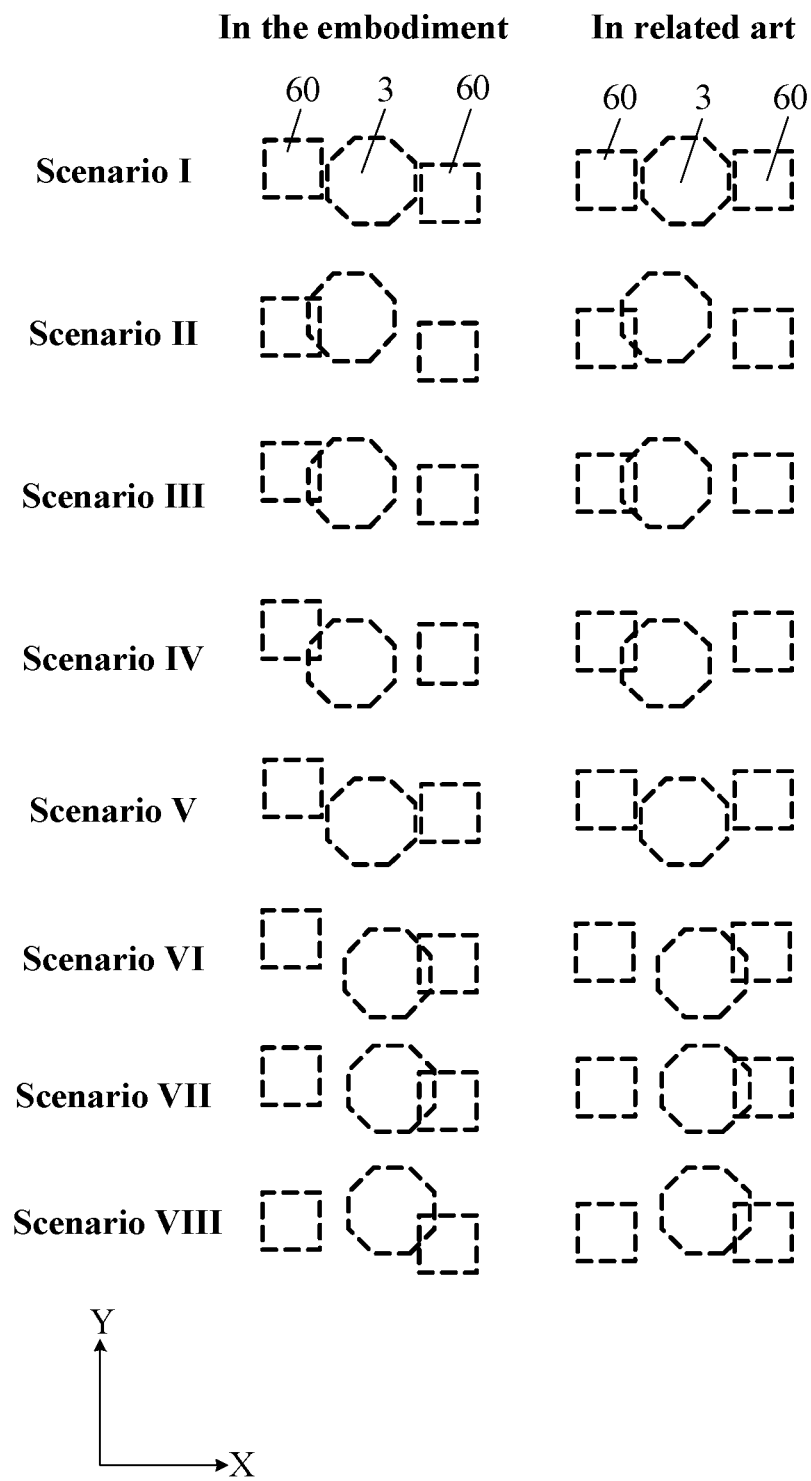
FIG. 5 is a schematic diagram showing a comparison between, a position relation between the drain electrode through hole and the photo spacer in the related art, and a position relation between the drain electrode through hole and the photo spacer provided by an embodiment of the present disclosure.

As shown in FIG. 4 and FIG. 5, FIG. 4 is a schematic diagram showing a position relation between the drain electrode through hole and the photo spacer in the partial region in FIG. 2; FIG. 5 is a schematic diagram showing a comparison between, a position relation between the drain electrode through hole and the photo spacer in the related art, and a position relation between the drain electrode through hole and the photo spacer provided by an embodiment of the present disclosure. The two adjacent support sub-pixels in the row direction refer to two support sub-pixels corresponding to the photo spacer, that is, the photo spacer 3 is provided at a position corresponding to the two adjacent support sub-pixels in the row direction. It should be noted that, a partial structure shown in FIG. 2 is omitted in FIG. 4, and only the positions of a gate line 21, a data line 22, the drain electrode through hole 60 and the photo spacer 3 are illustrated. In addition, a dashed line area of the photo spacer 3 shown in FIG. 4 and FIG. 5 indicates that the photo spacer 3 is located at the surface close to the array substrate, and FIG. 4 only illustrates a structure in which the photo spacer 3 is located at an ideal position. The photo spacer 3 is located at a position just between two drain electrode through holes 60, that is, the two drain electrode through holes 60 are symmetrically disposed with respect to the photo spacer 3. As shown in FIG. 5, in an embodiment, the drain electrode through holes 60 corresponding to two adjacent support sub-pixels in the row direction (X direction) are disposed by being unaligned in the column direction (Y direction). In the related art, the drain electrode through holes 60 corresponding to two adjacent support sub-pixels in the row direction (X direction) are disposed by aligning with one another in the column direction (Y direction). As shown in Table 1, in combination with Table 1 and FIG. 5, the effects of the embodiments of the present disclosure will be further illustrated in the following by comparison of various scenarios. Table 1 shows the parameter comparison of various scenarios between the embodiments of the present disclosure and the related art. In Table 1, the second column indicates a coordinate of the photo spacer in the X direction, the third column indicates a coordinate of the photo spacer in the Y direction, the fourth column indicates an overlapping area of the photo spacer 3 and the drain electrode through hole 60 in the embodiment, the fifth column indicates an overlapping area of the photo spacer 3 and the drain electrode through hole 60 in the related art.

TABLE 1

|  | Coordinate in X direction | Coordinate in Y direction | Overlapping area in the embodiment ($\mu m^2$) | Overlapping area in the related art ($\mu m^2$) |
| --- | --- | --- | --- | --- |
| Scenario I | 0 | 0 | 0 | 0 |
| Scenario II | −2.5 | 2.5 | 4.69 | 3.95 |
| Scenario III | −2.5 | 0 | 3.95 | 4.69 |
| Scenario IV | −2.5 | −2.5 | 2.95 | 3.95 |
| Scenario V | 0 | −2.5 | 0 | 0 |
| Scenario VI | 2.5 | −2.5 | 4.69 | 3.95 |
| Scenario VII | 2.5 | 0 | 3.95 | 4.69 |
| Scenario VIII | 2.5 | 2.5 | 2.95 | 3.95 |

In Scenario I, the photo spacer 3 is disposed at an ideal position, i.e., the photo spacer 3 is located just between the two drain electrode through holes 60, in this case, no matter in the related art or in the present disclosure, there is no overlapping area between the photo spacer 3 and the electrode through holes 60. In Scenario II, the photo spacer 3 is disposed at upper left side of the ideal position, the area of the overlapping area of the photo spacer 3 and the drain electrode through hole 60 in the present disclosure is 4.69 $\mu m^2$, the area of the overlapping area of the photo spacer 3 and the drain electrode through hole 60 in the related art is 3.95 $\mu m^2$. In Scenario III, the photo spacer 3 is disposed at direct left side of the ideal position, the area of the overlapping area of the photo spacer 3 and the drain electrode through hole 60 in the present disclosure is 3.95 $\mu m^2$, the area of the overlapping area of the photo spacer 3 and the drain electrode through hole 60 in the related art is 4.69 $\mu m^2$, that is, the area of the overlapping area of the photo spacer 3 and the drain electrode through hole 60 in the present disclosure is smaller than that in the related art, the problem of squeezing light leakage due to uneven support surface of the photo spacer 3 is less likely to be caused. In Scenario IV, the photo spacer 3 is disposed at lower left side of the ideal position, the area of the overlapping area of the photo spacer 3 and the drain electrode through hole 60 in the present disclosure is 2.95 $\mu m^2$, the area of the overlapping area of the photo spacer 3 and the drain electrode through hole 60 in the related art is 3.95 $\mu m^2$, that is, the area of the overlapping area of the photo spacer 3 and the drain electrode through hole 60 in the present disclosure is smaller than that in the related art, the problem of squeezing light leakage due to uneven support surface of the photo spacer 3 is less likely to be caused. In Scenario V, the photo spacer 3 is dispose at direct lower side of the ideal position, in this case, no matter in the related art or in the present disclosure, there is no overlapping area between the photo spacer 3 and the electrode through holes 60. In Scenario VI, the photo spacer 3 is disposed at lower right side of the ideal position, the area of the overlapping area of the photo spacer 3 and the drain electrode through hole 60 in the present disclosure is 4.69 $\mu m^2$, the area of the overlapping area of the photo spacer 3 and the drain electrode through hole 60 in the related art is 3.95 $\mu m^2$. In Scenario VII, the photo spacer 3 is disposed at direct right side of the ideal position, the area of the overlapping area of the photo spacer 3 and the drain electrode through hole 60 in the present disclosure is 3.95 $\mu m^2$, the area of the overlapping area of the photo spacer 3 and the drain electrode through hole 60 in the related art is 4.69 $\mu m^2$, that is, the area of the overlapping area of the photo spacer 3 and the drain electrode through hole 60 in the present disclosure is smaller than that in the related art, the problem of squeezing light leakage due to uneven support surface of the photo spacer 3 is less likely to be caused. In Scenario VIII, the photo spacer 3 is disposed at upper right side of the ideal position, the area of the overlapping area of the photo spacer 3 and the drain electrode through hole 60 in the present disclosure is 2.95 $\mu m^2$, the area of the overlapping area of the photo spacer 3 and the drain electrode through hole 60 in the related art is 3.95 $\mu m^2$, that is, the area of the overlapping area of the photo spacer 3 and the drain electrode through hole 60 in the present disclosure is smaller than that in the related art, the problem of squeezing light leakage due to uneven support surface of the photo spacer 3 is less likely to be caused.

An orthographic projection of the photo spacer 3 to the plane, where the array substrate is located, is usually an approximate circle or a polygon that is similar to a circle. In an embodiment, after the drain electrode through holes 60 corresponding to two adjacent support sub-pixels in the row direction are arranged by being unaligned in the column direction, when the photo spacer 3 deviates from the ideal position due to the processing and other reasons, the overlapping area of the photo spacer 3 and the drain electrode through hole 60 in the present disclosure is more likely to be decreased in comparison with that in the related art, so that the problem of squeezing light leakage due to uneven support surface of the photo spacer 3 can be alleviated, which can also be verified by an analysis of Table 1. In addition, in the process of manufacturing the photo spacer 3, there is a small possibility that the photo spacer 3 deviates from both the row direction and the column direction, therefore, with such an arrangement of the drain electrode through holes 60 corresponding to two adjacent support sub-pixels in the row direction in the present disclosure, the problem of squeezing light leakage due to uneven support surface of the photo spacer 3 is further alleviated.

Figure 6:
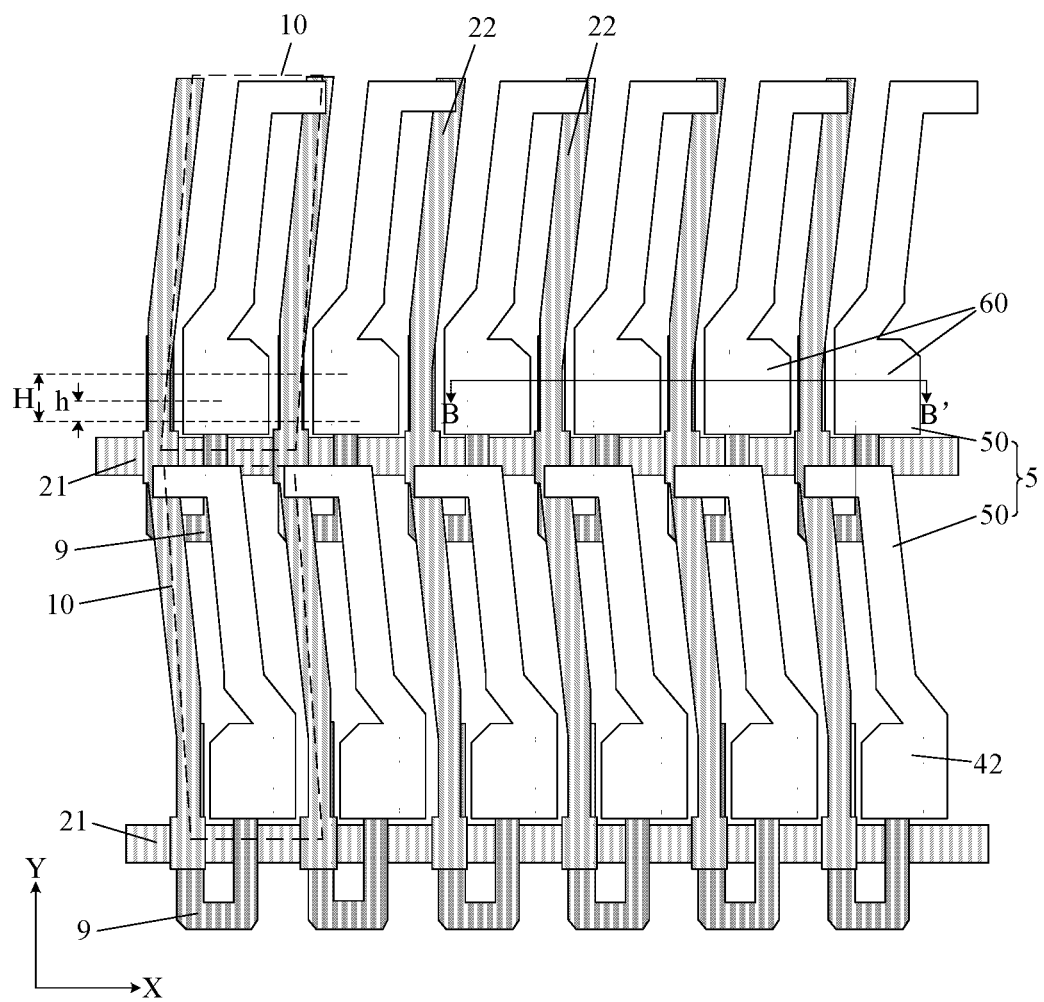
FIG. 6 is a top view of a partial region of another array substrate provided by an embodiment of the present disclosure.

Optionally, as shown in FIG. 2, it is possible that only the drain electrode through holes 60 corresponding to the support sub-pixels, which correspond to the photo spacers 3, are arranged by being unaligned, or it is also possible that all of the drain electrode through holes 60 corresponding to the sub-pixels are arranged by being unaligned with one another. As shown in FIG. 6, FIG. 6 is a top view of a partial region of another array substrate provided by an embodiment of the present disclosure. As for any one row of sub-pixels 10 of the plurality of sub-pixels 10, the drain electrode through holes 60 corresponding to any two adjacent sub-pixels are arranged by being unaligned in the column direction.

When the drain electrode through holes 60 corresponding to any two adjacent support sub-pixels in the row direction are arranged by being unaligned in the column direction, all of the photo spacers 3 can achieve their function without the need of distinguishingly arranging the drain electrode through hole 60 corresponding to a specific sub-pixel 10, which makes it easier during implementation.

Optionally, as shown in FIG. 6, as for any one row of sub-pixels 10 of the plurality of sub-pixels 10, the drain electrode through hole 60 corresponding to an odd column of sub-pixel 10 and the drain electrode through hole 60 corresponding to an even column of sub-pixel deviate toward opposite directions in the column direction.

For example, as shown in FIG. 6, the drain electrode through holes 60 corresponding to all the odd columns of the sub-pixels 10 deviate upward, and the drain electrode through holes 60 corresponding to the even columns of the sub-pixels 10 deviate upward, so that the drain electrode through holes 60 can be distributed more uniformly. As for the unaligned distribution of the drain electrode through holes 60, it should be that the influence on other components should be as little as possible, so that its influence on the display effect can be minimized.

Figure 7:
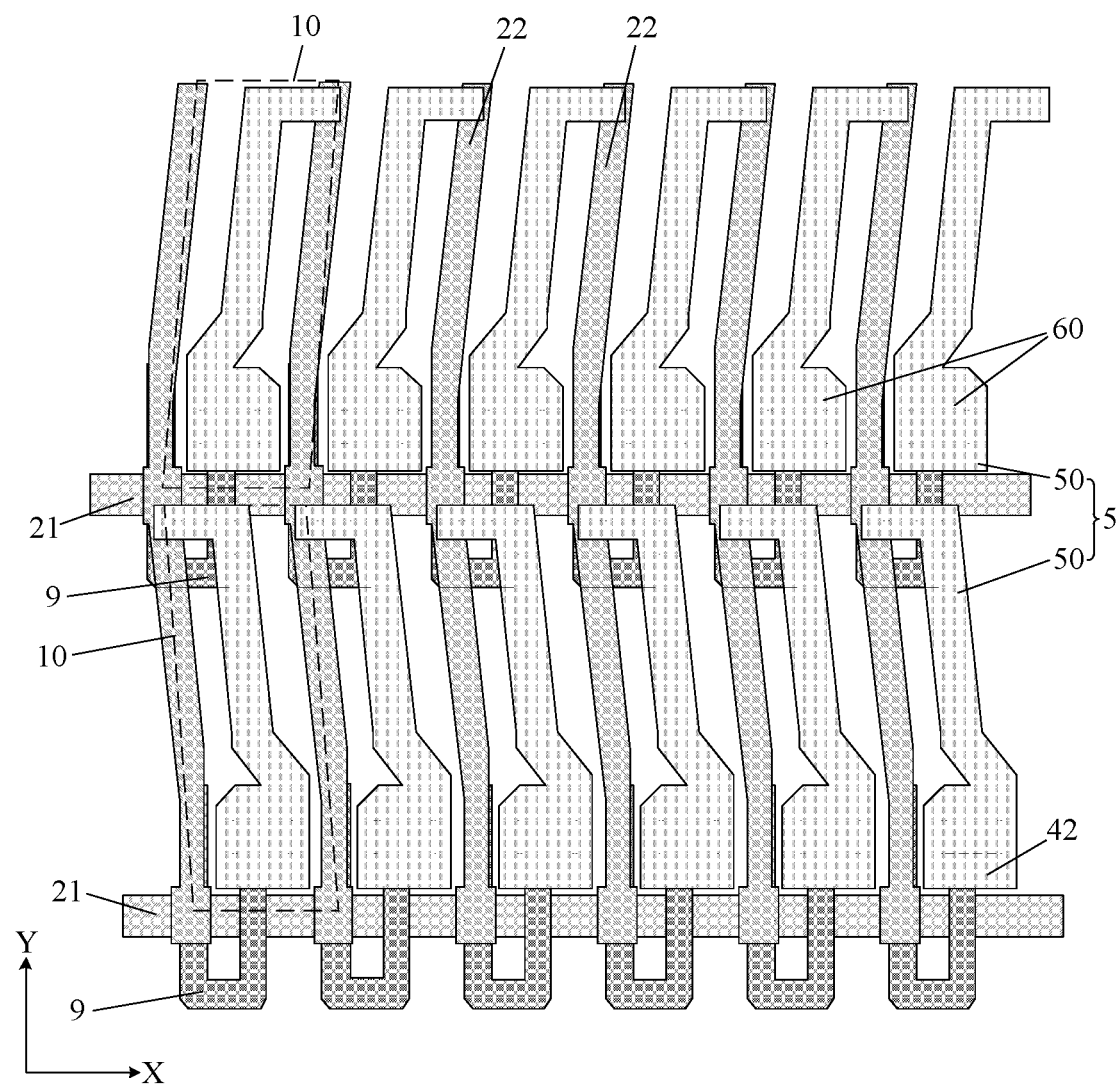
FIG. 7 is a top view of a partial region of another array substrate provided by an embodiment of the present disclosure.

Optionally, in the structure shown in FIG. 6, in each column of sub-pixels 10, the drain electrode through holes 60 deviate toward the same direction in the column direction. For example, the drain electrode through holes 60 corresponding to the odd columns of the sub-pixels 10 deviate upward, and the drain electrode through holes 60 corresponding to the even columns of the sub-pixels 10 deviate downward. In other embodiments, other distributions of the drain electrode through holes 60 may also be provided. For example, as shown in FIG. 7, as for any one column of sub-pixels 10 of the plurality of sub-pixels 10, the drain electrode through holes 60 corresponding to any two adjacent sub-pixels deviate toward opposite directions in the column direction.

On the basis that two adjacent drain electrode through holes 60 in the same row of sub-pixels 10 deviate toward opposite directions, moreover, two adjacent rows of drain electrode through holes 60 are arranged in different manners, so that the drain electrode through holes 60 on the entire display panel can be distributed more uniformly. For example, as for any one column of sub-pixels 10 shown in FIG. 7, the drain electrode through hole 60 corresponding to one sub-pixel 10 of two adjacent sub-pixels 10 deviates upward, and the drain electrode through hole 60 corresponding to the other one sub-pixel 10 of the two adjacent sub-pixels 10 deviates downward.

Optionally, as shown in FIG. 6, as for two adjacent support sub-pixels in the row direction (X direction), a deviation distance h between the unaligned two drain electrode through holes 60 in the column direction (Y direction) is less than a width H of any drain electrode through hole 60 in the column direction (Y direction).

A deviation distance h between unaligned two drain electrode through holes 60 is less than the width H of the drain electrode through hole 60 in the column direction (Y direction), i.e., a deviation distance between unaligned two drain electrode through holes 60 varies within a certain range and is not excessively large, and the reason lies in that, when the deviation distance between the two is excessively large, space for other components would be decreased, and an aperture ratio of the display panel would be decreased, which may bring adverse effects to display effect of the panel. On the other hand, the smaller the deviation distance between two drain electrode through holes 60 is, the poorer the improvement with respect of the evenness of the support surface of the photo spacer can be achieved. Therefore, both the two aspects should be taken into account when determining the distance h.

Optionally, as shown in FIG. 3, the array substrate further includes: a common electrode layer 7 disposed between the source-drain metal layer 4 and the pixel electrode layer 5. The insulation layer 6 includes a first insulation layer 61 and a second insulation layer 62. The first insulation layer 61 is disposed between the source-drain metal layer 4 and the common electrode layer 7, and the second insulation layer 62 is disposed between the common electrode layer 7 and the pixel electrode layer 5.

As shown in FIG. 3, the first insulation layer 61 has a relatively large thickness and provides the function of planarization. The second insulation layer 62 has a relatively small thickness and provides the function of insulating between the pixel electrode layer 5 and the common electrode layer 7. Since two insulation layers are disposed between the pixel electrode layer 5 and the source-drain metal layer 4, the drain electrode through hole 60 actually includes a though hole in the first insulation layer 61 and a through hole in the second insulation layer 62. In other embodiments, a position relation between the pixel electrode layer and the common electrode layer is not limited to the manner shown in FIG. 3. For example, the pixel electrode layer may be disposed between the common electrode layer and the source-drain metal layer, or, the pixel electrode layer and the common electrode layer may be disposed in the same layer.

Optionally, as shown in FIG. 3, the above-mentioned array substrate further includes: a gate metal layer 8 disposed at a side of the source-drain metal layer 4 away from the common electrode layer 7; an active layer 9 disposed at a side of the gate metal layer 8 away from the common electrode layer 7; an interlayer insulation layer 10 disposed between the gate metal layer 8 and the source-drain metal layer 4; a gate insulation layer 11 disposed between the gate metal layer 8 and the active layer 9. The gate metal layer 8 includes a plurality of gate electrodes, and each sub-pixel corresponds to a gate electrode. The source-drain metal layer 4 further includes a plurality of source electrodes, and each sub-pixel corresponds to a source electrode 41. In each sub-pixel, the source electrode 41 is connected to the active layer 9, and the drain electrode 42 is connected to the active layer 9.

As shown in FIG. 2 and FIG. 3, the array substrate includes a plurality of sub-pixels 10 defined by a plurality of rows of gate lines 21 intersecting with a plurality of columns of data lines 22. Each of the plurality of sub-pixels 10 is provided with a thin film transistor (Thin Film Transistor, TFT), a pixel electrode 50 and a common electrode. The TFT includes the gate electrode, the active layer 9, the source electrode 41 and the drain electrode 42. The portion where the gate line 21 overlaps with the active layer 9 is the gate electrode. The plurality of rows of gate lines 21 sequentially provide a scan signal to each row of TFTs, so as to realize scanning during display. The array substrate may further include a drive chip connected to each column of data lines 22, so as to provide a data signal required for display. Under the control of a corresponding gate line 21, a data line 22 corresponding to the source electrode 41 of the TFT charges/discharges the pixel electrode 50 corresponding to the drain electrode 42 via the TFT. An electric field is formed between the pixel electrode 50 and the common electrode for driving liquid crystal to deflect, so as to realize display function.

Figure 8:
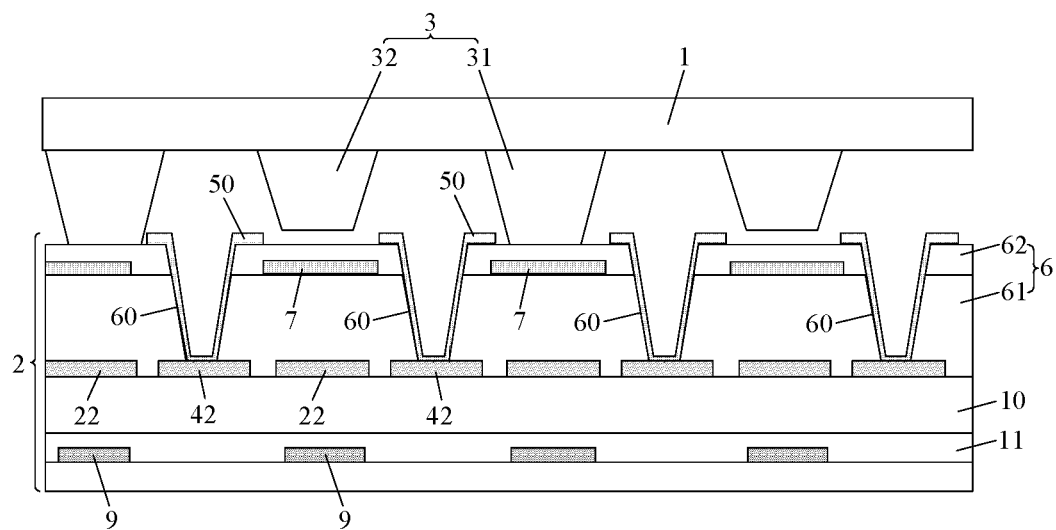
FIG. 8 is a schematic cross-sectional view of a partial region of a display panel provided by an embodiment of the present disclosure.

As shown in FIG. 8, FIG. 8 is a schematic cross-sectional view of a partial region of a display panel provided by an embodiment of the present disclosure. The present disclosure further provides a display panel, including: the array substrate 2 in any one of the above embodiments (taking the array substrate 2 shown in FIG. 8 being the array substrate in the embodiment shown in FIG. 6 as an example, and the cross-section position of the array substrate shown in FIG. 8 being the cross-section position of line BB' shown in FIG. 6); a color film substrate 1 disposed opposite to the array substrate 2, in which an insulation layer being disposed at a side of the source-drain metal layer close to the color film substrate 1; a photo spacer 3 disposed between the array substrate 2 and the color film substrate 1, an orthographic projection of the photo spacer 3 to the plane where the array substrate 2 is located overlaps with an area between two drain electrode through holes 60 corresponding to two adjacent support sub-pixels in the row direction.

Since different portions of the photo spacer 3 have different cross-sectional areas, for example, usually an area of an upper surface is generally larger than that of a lower surface, in this case, an orthographic projection of the photo spacer 3 to the plane where the array substrate 2 is located is the surface area of a portion of the photo spacer 3 close to the color film substrate 1. The orthographic projection of the photo spacer 3 to the plane where the array substrate 2 is located overlaps with an area between two drain electrode through holes 60 corresponding to two adjacent support sub-pixels in the row direction, that is, a position corresponding two adjacent support sub-pixels in the row direction is provided with the photo spacer 3, and the photo spacer 3 is ideally located at the overlapping area of two drain electrode through holes 60 corresponding to two adjacent support sub-pixels in the row direction. Due to the processing and other reasons, the orthographic projection of the photo spacer 3 to the plane where the array substrate 2 is located may be only partially located between two drain electrode through holes 60. It should be noted that, the structure and principle of the array substrate 2 are the same as those in the above embodiments, which will not be further described herein.

As for the display panel in the embodiments, after the drain electrode through holes corresponding to two adjacent support sub-pixels in the row direction are arranged by being unaligned in the column direction, when the photo spacer deviates from an ideal position due to the processing and other reasons, the overlapping area of the photo spacer and the drain electrode through hole in the present disclosure is more likely to be decreased in comparison with that in the related art, so that the problem of squeezing light leakage due to uneven support surface of the photo spacer can be alleviated.

Optionally, the photo spacers 3 include a primary photo spacer 31 and an auxiliary photo spacer 32, and a height of the auxiliary photo spacer 32 is smaller than that of the primary photo spacer 31.

The primary photo spacer 31 is used to support the array substrate 2 and the color film substrate 1 in any state, and the auxiliary photo spacer 32 is used to support the array substrate 2 and the color film substrate 1 in a pressed state. As for both the primary photo spacer 31 and the auxiliary photo spacer 32, the drain electrode through hole 60 needs to be arranged according to the unaligned distribution as described in the above embodiments, so that the problem of squeezing light leakage due to uneven support surface of the photo spacer can be alleviated.

Figure 9:
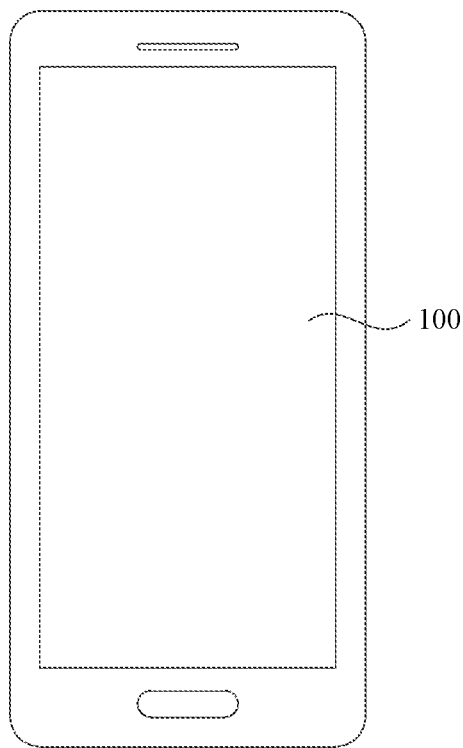
FIG. 9 is a structural schematic diagram of a display device provided by an embodiment of the present disclosure.

As shown in FIG. 9, FIG. 9 is a structural schematic diagram of a display device provided by an embodiment of the present disclosure. The present disclosure further provides a display device including the above-mentioned display panel 100.

The structure and principle of the liquid crystal display panel 100 are the same as those in the above embodiments, which will not be further described herein. The display device may be any electronic device having a display function, such as a touch screen, a cellphone, a tablet computer, a notebook computer, an electronic paper book, a television and the like.

As for the display device in the present disclosure, after the drain electrode through holes corresponding to two adjacent support sub-pixels in the row direction are arranged by being unaligned in the column direction, when the photo spacer deviates from an ideal position due to the processing and other reasons, the overlapping area of the photo spacer and the drain electrode through hole in the present disclosure is more likely to be decreased in comparison with that in the related art, so that the problem of squeezing light leakage due to uneven support surface of the photo spacer can be alleviated.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. An array substrate, comprising:
    a source-drain metal layer,
    a pixel electrode layer,
    an insulation layer located between the source-drain metal layer and the pixel electrode layer, and
    a plurality of sub-pixels distributed in an array, wherein each of the plurality of sub-pixels corresponds to a drain electrode contained in the source-drain metal layer, a pixel electrode contained in the pixel electrode layer, and a drain through-hole defined in the insulation layer, and the pixel electrode is connected to the drain electrode via the drain through-hole;
    wherein for any one row of the array, in a column direction, each drain through hole is located at a lower side of the sub-pixel corresponding to the drain electrode in the column direction; and
    wherein the plurality of sub-pixels comprises two adjacent support sub-pixels in a row direction, and two drain through-holes respectively corresponding to the two adjacent support sub-pixels are unaligned with respect to each other in the column direction,
    wherein the two drain through-holes respectively corresponding to the two adjacent support sub-pixels are unaligned with respect to each other in the column direction by a distance less than a width of any one of the drain through-holes in the column direction.

2. The array substrate according to claim 1, wherein in any one row of the array, for any adjacent two of the sub-pixels, the drain through holes are arranged by being unaligned in the column direction.

3. The array substrate according to claim 2, wherein in any one row of the array, the drain through-hole corresponding to each sub-pixel in odd-numbered columns and the drain through-hole corresponding to each sub-pixel in even-numbered columns deviate toward opposite directions in the column direction.

4. The array substrate according to claim 3, wherein in any one row of the array, the drain through holes corresponding to any adjacent two of the sub-pixels deviate toward opposite directions in the column direction.

5. The array substrate according to claim 1, further comprising:
    a common electrode layer disposed between the source-drain metal layer and the pixel electrode layer;
    wherein the insulation layer comprises a first insulation layer and a second insulation layer, the first insulation layer is disposed between the source-drain metal layer and the common electrode layer, and the second insulation layer is disposed between the common electrode layer and the pixel electrode layer.

6. The array substrate according to claim 5, wherein the array substrate further comprises:
    a gate metal layer disposed at a side of the source-drain metal layer away from the common electrode layer;
    an active layer disposed at a side of the gate metal layer away from the common electrode layer;
    an interlayer insulation layer disposed between the gate metal layer and the source-drain metal layer; and
    a gate insulation layer disposed between the gate metal layer and the active layer;
    wherein each of the plurality of sub-pixels further corresponds to a gate electrode contained in the gate metal layer and a source electrode contained in the source-drain metal layer, and both the source electrode and the drain electrode are connected to the active layer.

7. A display panel comprising an array substrate, wherein the array substrate comprises:
a source-drain metal layer,
a pixel electrode layer,
an insulation layer located between the source-drain metal layer and the pixel electrode layer, and
a plurality of sub-pixels distributed in an array, wherein each of the plurality of sub-pixels corresponds to a drain electrode contained in the source-drain metal layer, a pixel electrode contained in the pixel electrode layer, and a drain through-hole defined in the insulation layer, and the pixel electrode is connected to the drain electrode via the drain through-hole;
wherein for any one row of the array, in a column direction, each drain through hole is located at a lower side of the sub-pixel corresponding to the drain electrode in the column direction; and
wherein the plurality of sub-pixels comprises two adjacent support sub-pixels in a row direction, and two drain through-holes respectively corresponding to the two adjacent support sub-pixels are unaligned with respect to each other in the column direction;
wherein the display panel further comprises:
a color film substrate disposed opposed to the array substrate, and
at least one photo spacer disposed between the array substrate and the color film substrate,
wherein the insulation layer in the array substrate is disposed at a side of the source-drain metal layer close to the color film substrate; and
wherein an orthographic projection of the photo spacer on a plane where the array substrate is located overlaps with an area between the two drain through-holes corresponding to the two adjacent support sub-pixels in the row direction.

8. The display panel according to claim 7, wherein
the at least one photo spacer is a plurality of photo spacers, and the plurality of photo spacers comprises a primary photo spacer and an auxiliary photo spacer, a height of the auxiliary photo spacer is smaller than a height of the primary photo spacer.

9. A display device comprising a display panel, wherein the display panel comprises an array substrate, and the array substrate comprises:
a source-drain metal layer,
a pixel electrode layer,
an insulation layer located between the source-drain metal layer and the pixel electrode layer, and
a plurality of sub-pixels distributed in an array, wherein each of the plurality of sub-pixels corresponds to a drain electrode contained in the source-drain metal layer, a pixel electrode contained in the pixel electrode layer, and a drain through-hole defined in the insulation layer, and the pixel electrode is connected to the drain electrode via the drain through-hole;
wherein for any one row of the array, in a column direction, each drain through hole is located at a lower side of the sub-pixel corresponding to the drain electrode in the column direction; and
wherein the plurality of sub-pixels comprises two adjacent support sub-pixels in a row direction, and two drain through-holes respectively corresponding to the two adjacent support sub-pixels are unaligned with respect to each other in the column direction;
wherein the display panel further comprises:
a color film substrate disposed opposed to the array substrate, and
at least one photo spacer disposed between the array substrate and the color film substrate,
wherein the insulation layer in the array substrate is disposed at a side of the source-drain metal layer close to the color film substrate; and
wherein an orthographic projection of the photo spacer on a plane where the array substrate is located overlaps with an area between the two drain through-holes corresponding to the two adjacent support sub-pixels in the row direction.

10. The display device according to claim 9, wherein
the at least one photo spacer is a plurality of photo spacers, and the plurality of photo spacers comprises a primary photo spacer and an auxiliary photo spacer, a height of the auxiliary photo spacer is smaller than a height of the primary photo spacer.

\* \* \* \* \*